(12) United States Patent
Selvamanickam et al.

(10) Patent No.: US 11,881,328 B2
(45) Date of Patent: Jan. 23, 2024

(54) SUPERCONDUCTOR ARTICLE WITH DIRECTIONAL FLUX PINNING

(71) Applicants: University of Houston System, Houston, TX (US); SuperPower, Inc., Schenectady, NY (US)

(72) Inventors: Venkat Selvamanickam, Houston, TX (US); Yimin Chen, Bridgewater, NJ (US)

(73) Assignees: University of Houston System, Houston, TX (US); SuperPower, Inc., Schenectady, NY (US)

( * ) Notice: Subject to any disclaimer, the term of this patent is extended or adjusted under 35 U.S.C. 154(b) by 0 days.

(21) Appl. No.: 17/719,317

(22) Filed: Apr. 12, 2022

(65) Prior Publication Data
US 2022/0230784 A1    Jul. 21, 2022

Related U.S. Application Data

(63) Continuation of application No. 16/829,851, filed on Mar. 25, 2020, now abandoned, which is a continuation of application No. 15/384,486, filed on Dec. 20, 2016, now Pat. No. 10,607,753, which is a continuation of application No. 13/916,315, filed on Jun. 12, 2013, now abandoned.

(60) Provisional application No. 61/696,562, filed on Sep. 4, 2012, provisional application No. 61/658,546, filed on Jun. 12, 2012.

(51) Int. Cl.
| | | |
|---|---|---|
| *H01B 12/02* | (2006.01) | |
| *H10N 60/20* | (2023.01) | |
| *H10N 60/01* | (2023.01) | |
| *H10N 60/85* | (2023.01) | |
| *H01B 1/02* | (2006.01) | |
| *H01B 9/00* | (2006.01) | |

(52) U.S. Cl.
CPC ............. *H01B 12/02* (2013.01); *H01B 1/026* (2013.01); *H01B 9/006* (2013.01); *H10N 60/0828* (2023.02); *H10N 60/203* (2023.02); *H10N 60/857* (2023.02); *H10N 60/0632* (2023.02)

(58) Field of Classification Search
CPC ........ H01B 12/02; H01B 1/026; H01B 9/006; H10N 60/857; H10N 60/0828; H10N 60/203
See application file for complete search history.

(56) References Cited

U.S. PATENT DOCUMENTS

| | | |
|---|---|---|
| 2005/0159298 A1 | 7/2005 | Rupich et al. |
| 2007/0111893 A1 | 5/2007 | Kodenkandath et al. |

(Continued)

FOREIGN PATENT DOCUMENTS

| | | |
|---|---|---|
| JP | H04295015 A | 10/1992 |
| JP | 2008130291 A | 6/2008 |

(Continued)

OTHER PUBLICATIONS

Aytug et al., "Enhanced flux pinning in MOCVD-YCO films through Zr additions: systematic feasibility studies," Supercond. Sci. Technol. 23 (2010) 014005.

(Continued)

*Primary Examiner* — Paul A Wartalowicz
(74) *Attorney, Agent, or Firm* — Blank Rome LLP

(57) ABSTRACT

A method and composition for doped HTS tapes having directional flux pinning and critical current.

15 Claims, 5 Drawing Sheets

(56) References Cited

U.S. PATENT DOCUMENTS

2008/0153709 A1    6/2008   Rupich et al.
2011/0287939 A1    11/2011   Goyal

FOREIGN PATENT DOCUMENTS

JP          2012038476 A    2/2012
WO       2011132731 A    10/2011

OTHER PUBLICATIONS

Christen, et al., "Large, Orientation-Dependent Enhancements of Critical Currents in $Y1Ba_2Cu_3O_{7-x}$ Epitaxial Thin Films: Evidence for Intrinsic Flux Pinning?," Physica B 165-166, 1990.

European Search Report dated Dec. 18, 2015, for European Application No. 13804839.2.

Korean Office Action dated Nov. 16, 2015, for Korean Application No. 10-2015-7000739.

International Search Report and Written Opinion dated Feb. 24, 2014, for PCT Application No. PCT/US2013/045444.

Ghalsasi, Sameer, et al., "Optimization of the TFA-MOD Process for Introduction of $BaZrO_3$ Pinning Centers in YBCO Films," IEEE Transactions on Applied Superconductivity, vol. 21, No. 3, Jun. 1, 2011, pp. 3070-3074.

Safar, et al., "Anisotropy and Lorentz-force dependence of the critical currents in $YBa_2Cu_3O_{7-\delta}$ thick films deposited on nickel-alloy substrates," Rapid Communications, Physical Review B, 1995, vol. 52, No. 14.

Selvamanickam, et al., "Effect of rare-earth composition on microstructure and pinning properties of Zr-doped (Gd, Y) $Ba_2Cu_3O_x$ superconducting tapes," Supercond. Sci. Technol. 25, 2012.

Selvamanickam, et al., "Progress in research and development of IBAD-MOCVD based superconductor wires," Applied Superconductivity Conference, Washington D.C., Aug. 1-6, 2010.

Selvamanickam, et al., "Progress in SuperPower's 2G HTS Wire Development and Manufacturing," 2010 DOE Advanced Cables & Conductors Peer Review, Alexandria, VA, Jun. 29-Jul. 1, 2010.

Varanasi, C.V., "Thick $YBa_2Cu_3O_{7-x}+BaSnO_3$ Films with Enhanced Critical Current Density at High Magnetic Fields," Applied Physics Letters, vol. 93, No. 9, Sep. 2, 2008.

Zhou, et al., "Improved microstructure and enhanced low-field Jc in $(Y_{0.67}Eu_{0.33}) Ba_2Cu_3O_{7-\delta}$ films," Supercond. Sci. Technol. 21, 2008.

SUPERCONDUCTOR ARTICLE WITH DIRECTIONAL FLUX PINNING

CROSS-REFERENCE TO RELATED APPLICATIONS

This application is a continuation of U.S. application Ser. No. 16/829,851, filed on Mar. 25, 2020 and entitled "Superconductor Article with Directional Flux Pinning," which is a continuation of U.S. patent application Ser. No. 15/384,486 filed on Dec. 20, 2016, issued on Mar. 31, 2020 as U.S. Pat. No. 10,607,753 and entitled "Superconductor Article with Directional Flux Pinning," which is a continuation of U.S. application Ser. No. 13/916,315, filed on Jun. 12, 2013 and entitled "Superconductor Article with Directional Flux Pinning," which claims the benefit under 35 U.S.C. § 119 of U.S. Provisional Patent Application No. 61/658,546 filed on Jun. 12, 2012, entitled "Superconductor Article with Novel Directional Flux Pinning" and U.S. Provisional Patent Application No. 61/696,562 filed on Sep. 4, 2012, entitled "Superconductor Article with Novel Directional Flux Pinning" the entire disclosures of which are hereby incorporated herein by reference in their entirety for all purposes.

STATEMENT REGARDING FEDERALLY SPONSORED RESEARCH OR DEVELOPMENT

Not applicable.

BACKGROUND

Field of the Disclosure

This disclosure relates to superconductors, and more specifically, to improving the critical current retention of a superconducting tape in a magnetic field.

Background of the Disclosure

Several materials and systems are being researched in order to solve looming problems with energy generation, transmission, conversion, storage, and use. Superconductors may provide a unique systemic solution for a broad spectrum of energy problems. More specifically, superconductors enable high efficiencies in generators, power transmission cables, motors, transformers and energy storage. Further, superconductors transcend applications beyond energy to medicine, particle physics, communications, and transportation. Superconducting tapes continue to be enabled by creating epitaxial, single-crystal-like thin films on polycrystalline substrates.

The current carrying capability of conventional superconductors rapidly diminishes in a magnetic field. This performance decay represents a potential technical hurdle for certain applications. An exemplary application may include wind turbine generators where the generator coil may be subjected to magnetic fields of a few Tesla. Additionally, since superconductivity in high-temperature superconductors (HTS) is localized within their Cu—O planes, HTS materials exhibit strong anisotropic behavior. This anisotropy is evident in critical current measurements when a magnetic field is aligned at different angles with respect to the film surface. It is observed that the critical current of a standard HTS tape drops rapidly as the field is moved away from the film surface and reaches a low value when the field is oriented approximately perpendicular to the tape. The reduction in critical current is the limiting value in coils constructed with these tapes. Thus, flux pinning or immobilizing the magnetic flux lines through the superconductor is one method of maintaining HTS tape performance. Flux pinning improvement strategies for practical superconductors have been researched over the last decade to improve performance in real world or "field" applications.

Conventionally, the most researched approach has been to introduce defects into the superconductor that are comparable in lateral dimensions with superconducting coherence length. In the second generation (2G) HTS tapes, representative defects may be oxygen vacancies, threading dislocations, twin planes, impurity atoms, irradiation-induced columnar defects, and nanostructured inclusions of various composition and structure. Recently, approaches for columnar defect formation based on chemically doping the superconducting film with $BaZrO_3$ (BZO) or $BaSnO_3$ (BSO) have been researched, where the BZO and BSO inclusions form nanosized column. These columns, about 5 nm in diameter, form by a self-assembly process during superconductor film growth and appear to improve the pinning strength.

In certain applications, such as power transmission cable, the magnetic field is aligned primarily parallel to the tape. It has been shown that in a magnetic field of 0.1 T aligned parallel to the tape surface, the critical current of a standard MOCVD-based 2G HTS tape decreases by about 20% to about 30%, in other words, only between about 70 to 80% of the zero-field critical current is carried in the HTS tape. Comparatively, a first-generation HTS tape based on (Bi, Pb)—Sr—Ca—Cu—O has been found to retain over 90% of its critical current in a field of 0.1 T applied parallel to the tape. Thus, the critical current retention of 2G HTS tapes in magnetic fields applied parallel to the tape represents a potential hurdle to industrial application.

BRIEF SUMMARY

Disclosed herein is a superconducting tape comprising: a substrate, an overlying buffer and a superconductor. The superconductor has a critical current retention factor over about 90% when a magnetic field of about 0.1 T is applied about parallel to the tape. Further, there is disclosed a superconducting tape, wherein the superconductor has a critical current retention factor over about 50% when a magnetic field of about 0.5 T is applied about parallel to the superconductor. Additionally, there is disclosed a superconductor, wherein the superconductor has a critical current retention factor over about 30% when a magnetic field of about 1 T is applied about parallel to the superconducting tape.

Also, disclosed herein is a superconductor structure or a high-temperature superconductor structure having a critical current retention factor over about 30% when a magnetic field of about 1 T is applied parallel to the HTS and a critical current retention factor over about 15% when a magnetic field of about 1 T is applied about perpendicular to the tape. As disclosed herein, there is a plurality of thin film structures, including a high-temperature superconductor layer, having a manufacturing process incorporating at least one metal organic chemical vapor deposition process. The structures disclosed herein include at least one rare-earth metal.

The embodiments described herein comprise a combination of features and characteristics intended to address various shortcomings associated with certain prior superconductors. The various features and characteristics described above, as well as others, will be readily apparent to those skilled in the art upon reading the following detailed description of the disclosed embodiments, and by referring to the accompanying drawings.

BRIEF DESCRIPTION OF THE DRAWINGS

For a detailed description of the disclosed exemplary embodiments of the invention, reference will now be made to the accompanying drawings in which.

DETAILED DESCRIPTION OF THE DISCLOSED EMBODIMENTS

BZO addition results in improved critical current performance to HTS tapes. Additionally, this performance is primarily observed when the magnetic field is applied perpendicular to the superconducting tape. It is disclosed herein that with certain compositions containing high levels of rare-earth content, the critical current of Zr-doped tapes demonstrate improvements in critical current performance when the field was applied parallel to the tape. The improved critical current performance with certain compositions containing high levels of rare-earth content in Zr-doped tapes may be particularly evident in a magnetic field of about 0.1 T applied parallel to the tape. Likewise, superconducting tapes containing high-levels of rare-earth content utilizing other dopants such as Ta, Hf, Sn, Nb, Ti and Ce have similar critical current performance in a magnetic field of about 0.1 T applied parallel to the tape as shown by Zr-doped simulations.

Figure 1:
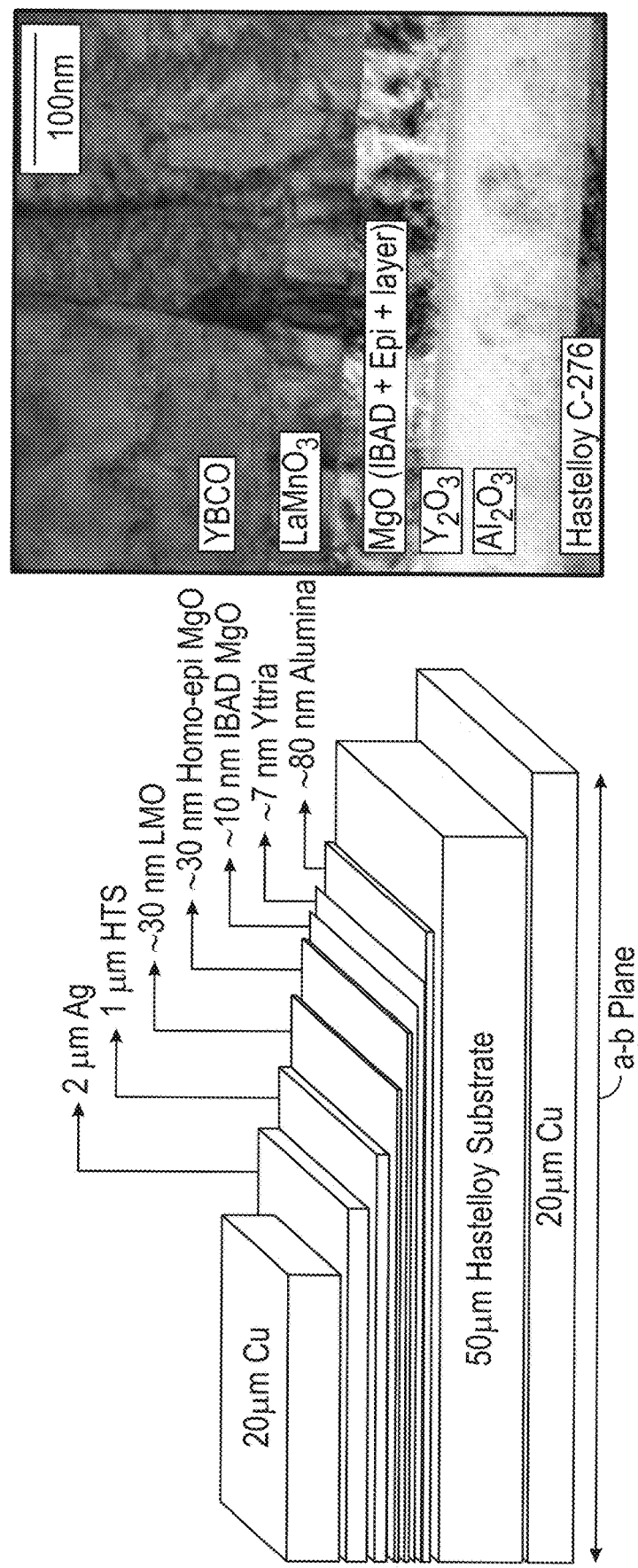
FIG. 1 illustrates a schematic cross-sectional microstructure of thin film superconducting tape adjacent to a photomicrograph thereof.

Referring to FIG. 1 there is illustrated an exemplary layered superconducting tape. The schematic shows the layers of the tape and directional orientation of the a-b plane discussed further hereinafter. Generally, the tape comprises an overlayer or buffer layer surrounding a Hastelloy substrate supporting a superconductor. The superconductor is configured as a plurality of layers, comprising rare earth metals, dopants, and other metals without limitation. Adjacent the schematic is a photomicrograph of an exemplary superconducting tape illustrating the layers from the Hastellloy substrate to the YBCO layer, discussed hereinbelow in further detail.

Figure 2:
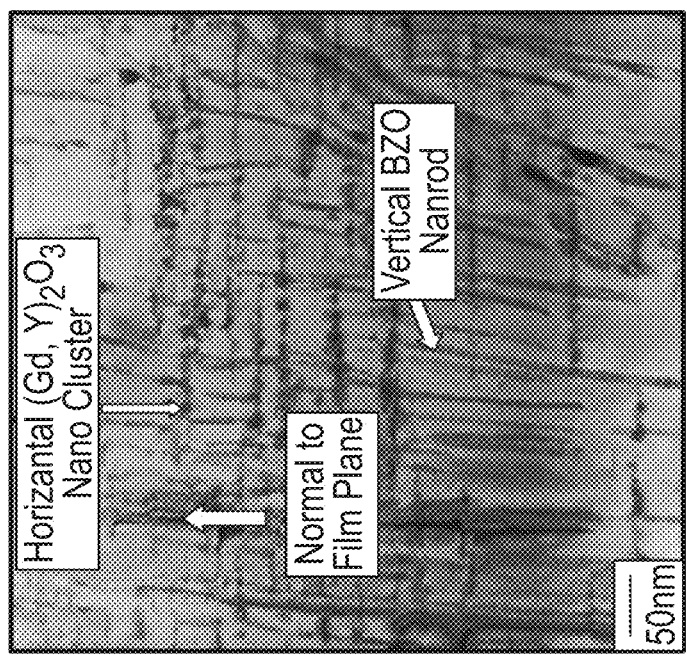
FIG. 2 illustrates a graphical representation of the anisotropy in critical current of a conventional, MOCVD-based HTS tape with and without self-assembled $BaZrO_3$ (BZO) nanocolumn and illustrates a graphical representation of the cross-sectional photomicrographic structure of a Zr-doped superconducting film synthesized by MOCVD showing abundant nanocolumnar defects of self-assembled BZO.
Figure 2:
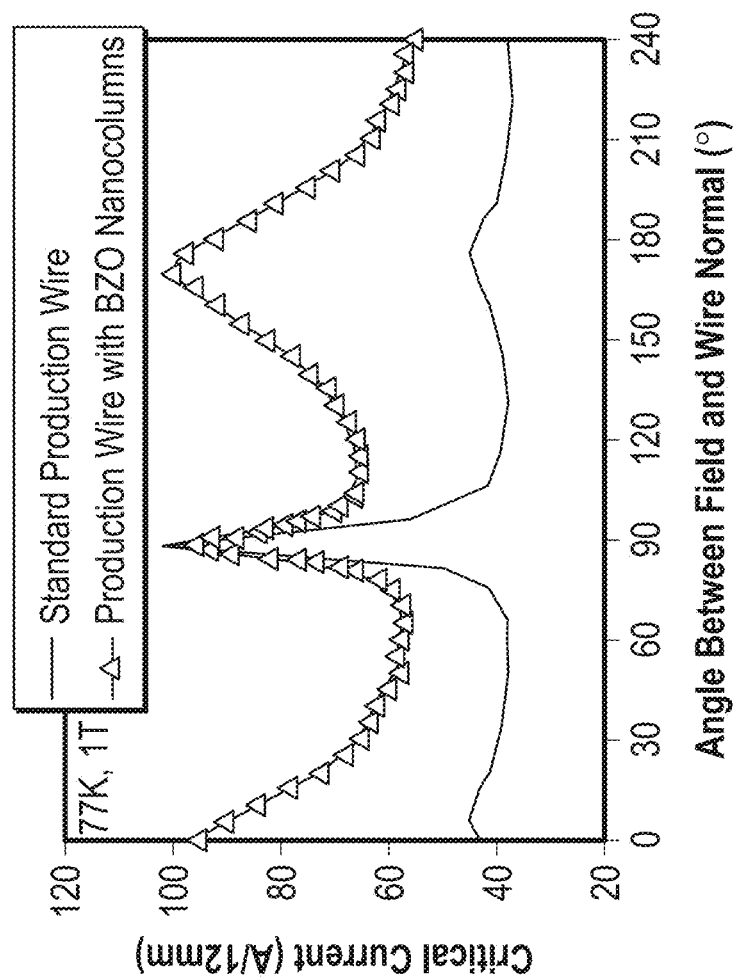

Referring now to FIG. 2, there is shown a photomicrograph of the cross-sectional microstructure of a (Gd,Y) $Ba_2Cu_3O_x$ (Gd—YBCO) film grown by MOCVD with BZO nanocolumns. The microstructure of the film is mostly oriented perpendicular to the film plane. Films having this microstructure or similar, exhibit two-fold improved performance in a magnetic field at about 77 K orientated approximately in the direction of the BZO nanocolumns and result in a lower anisotropy than found in a conventional tape as shown in FIG. 2. The nanocolumns exhibit a splay about the film growth direction, and an improved pinning is possible over a range of angular orientations, with respect to the film, of the magnetic field. However, as illustrated in FIG. 2, the Zr addition leads to a drop in critical current when the field is applied parallel to the tape.

Figure 3:
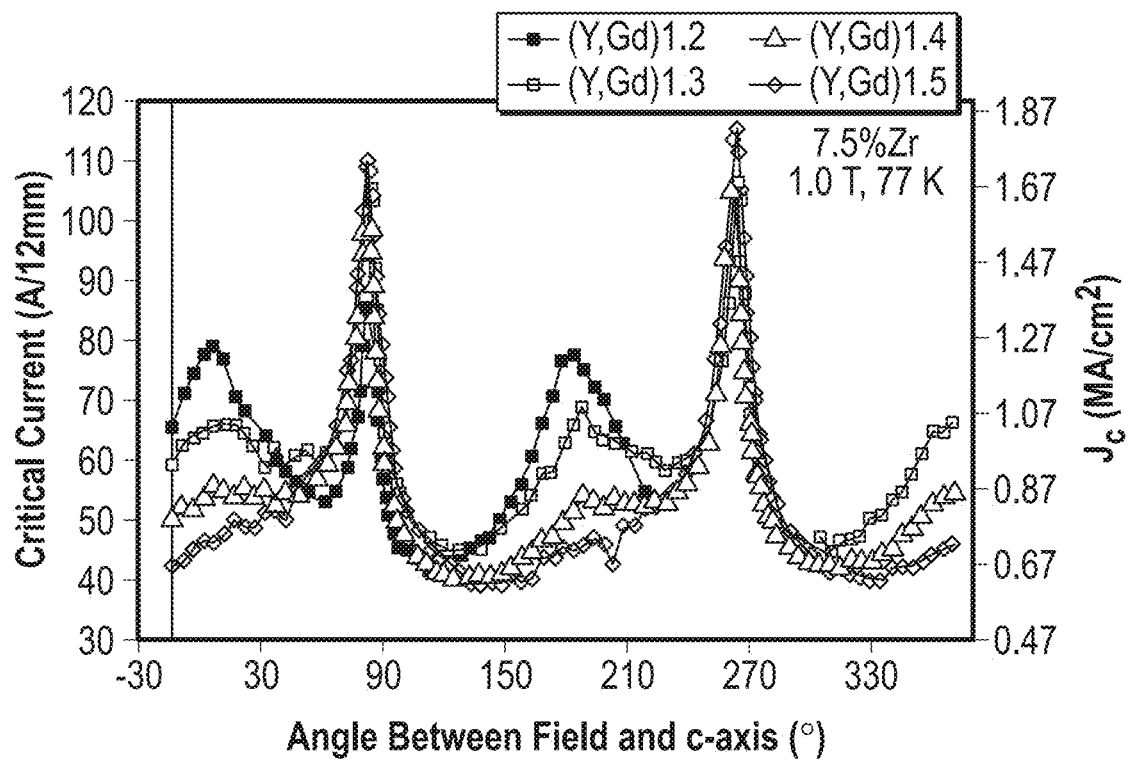
FIG. 3 illustrates a graph of the angular dependence of critical current of (Gd,Y)Ba—Cu—O tapes with Zr doping and increasing content of Y and Gd, at 77 K, 1 T.

Referring now to FIG. 3, the graph illustrates the angular dependence of critical current of $(Y_xGd_x)$—Ba—Cu—O tapes in a magnetic field of about 1 T at about 77 K, with about 7.5% Zr doping, when the value of x is increased from about 0.6 to about 0.75, in about 0.05 steps. The Ba and Cu content were maintained at the same level in all tapes, with the Cu content fixed at 3.0. The graph illustrates that the critical current in the orientation of field perpendicular to the tape decreases with increasing rare-earth content.

Figure 4:
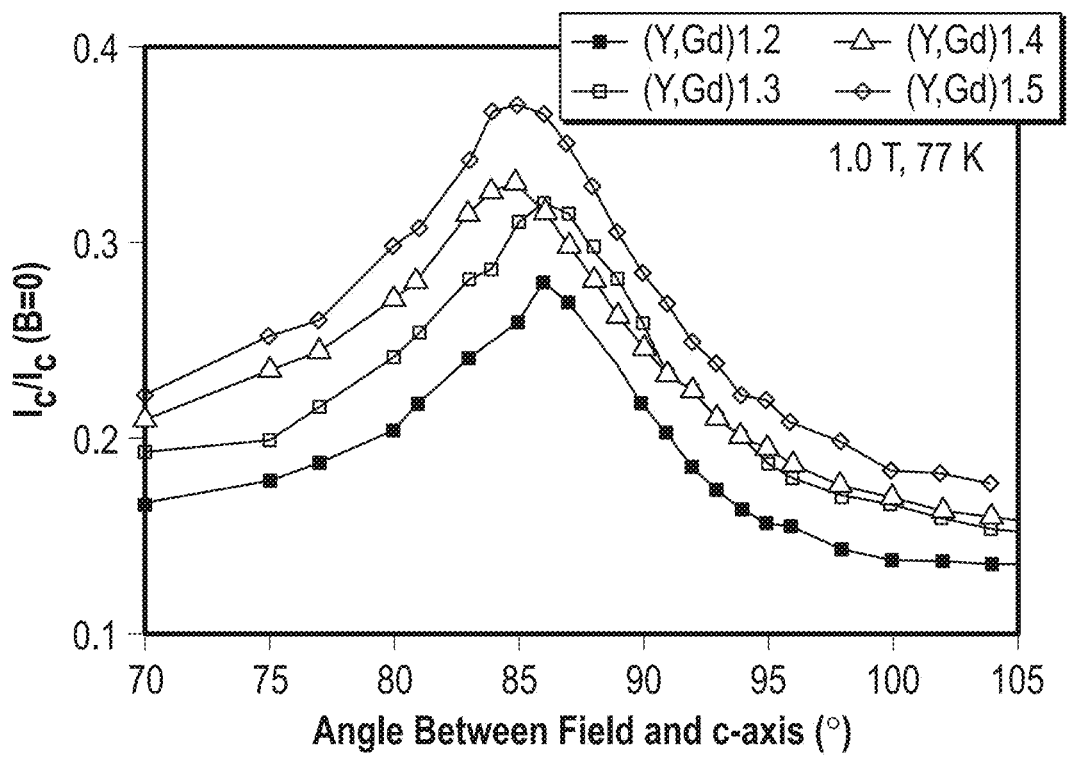
FIG. 4 illustrates a graph of a magnified view of the critical current peak from FIG. 3, in field orientation parallel to the tape, wherein the critical current values of the tapes have been normalized to their respective zero-field critical current values.

Furthermore, a magnified view of the peak in critical current in the orientation of field parallel to the tape is shown in FIG. 4. The critical current values of the exemplary tape compositions have been normalized to the respective critical current values in absence of an applied field. As FIG. 4 illustrates, the critical current in this field orientation increases commensurate and proportionally to the increasing rare-earth content.

Figure 5:
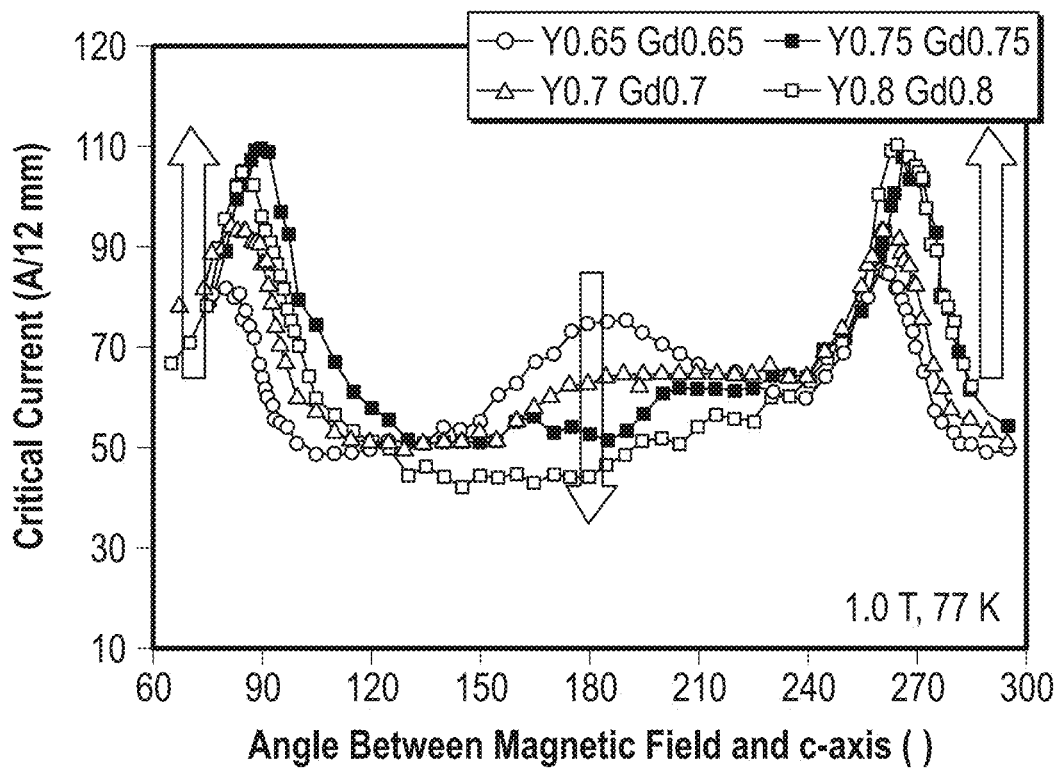
FIG. 5 illustrates a graphical analysis of the angular dependence of critical current of (Gd,Y)Ba—Cu—O tapes with 7.5% Zr doping and increasing content of Y and Gd, at 77 K, 1 T

Referring now to FIG. 5, the characteristics shown in FIGS. 3 and 4 are confirmed with respect to the critical current measurements on tapes with $(Y_xGd_x)$—Ba—Cu—O composition with 7.5% Zr doping and with x ranging from about 0.65 to about 0.8 in about 0.05 steps. In the exemplary configuration and composition of FIG. 5, the results of the angular dependence of critical current at about 77 K in a magnetic field of about 1 T and about 77 K are illustrated. More specifically, the critical current steadily increases when the magnetic field is aligned parallel to the tape and decreases when it is aligned perpendicular to the tape. Thus, considering the films were all at least similarly doped with Zr and included at least the similar resulting BZO nanocolumns, these configurations lead to improved critical current performance along the orientation of field perpendicular to the tape. Additionally, the critical current of the tapes at zero applied magnetic field(s) was only minimally degraded with increasing rare-earth content.

Figure 6:
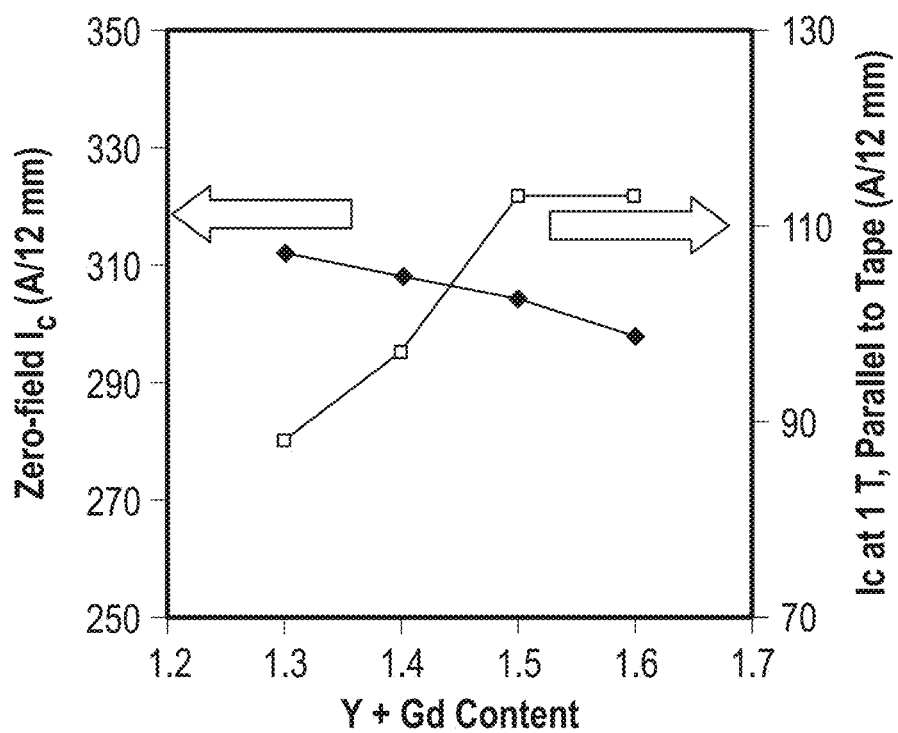
FIG. 6 is a graphical analysis of the critical current at 77 K, zero applied magnetic field and critical current at 1 T in the orientation of field parallel to the tape in (Gd,Y)Ba—Cu—O tapes with 7.5% Zr doping and increasing content of Y and Gd.

Referring now to FIG. 6, the critical current at zero applied magnetic field decreases only by about 14 Amperes or about 4% when the rare-earth proportion x is increased into a range from about 1.3 to about 1.6. FIG. 6 also illustrates the changes in critical current values in an applied magnetic field of about 1 T parallel to the tape. The critical current in the orientation of field parallel to the a-b plane increased significantly with higher rare earth addition. The critical current value was found to increase by about 28% as the rare earth proportion x was increased into a range from about 1.3 to about 1.5. In power transmission applications, such as cables or wires, the magnetic field that the superconducting tape experiences or is subjected to is typically around 0.1 T or less. While FIG. 6 illustrates the significantly improved critical current in the orientation of magnetic field applied parallel to the tape at about 1 T, it may be understood that the improvement may not extend to a lower field value of about 0.1 T in all instances. Thus, in exemplary instances a superconductor structure or tape comprises a ratio of at least 1.5 total rare-earth metals to at least 3 copper.

Figure 7:
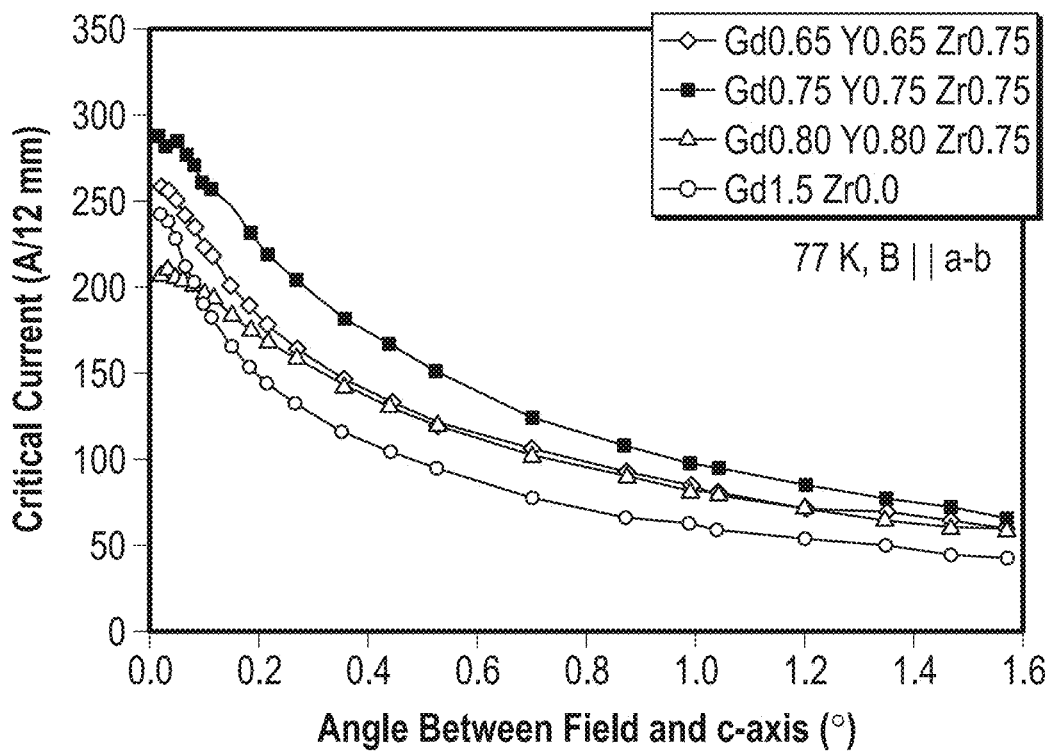
FIG. 7 illustrates the graphical analysis of a critical current at 77 K, in a magnetic field applied parallel to the tape surface of (Gd,Y)Ba—Cu—O tapes with 7.5% Zr doping and increasing content of Y and Gd, wherein the performance of a reference tape with no Zr addition is also included.

Referring now to FIG. 7, there is illustrated that the critical current of (Gd,Y)Ba—Cu—O tapes made with four different precursors according to exemplary configurations of the present disclosure. More specifically, there are shown at least three precursor recipes that consisted of about 7.5% Zr doping, having compositions of $(Gd_{0.65}Y_{0.65})$, $(Gd_{0.75}Y_{0.75})$, and $(Gd_{0.80}Y_{0.80})$ and an undoped reference precursor recipe similar to the current formulations $(Gd_{1.5})$. As shown, are the Ba, Cu and Zr content in the precursors are maintained at about the same ratio. FIG. 7 also includes a conventional or reference precursor recipe without Zr addition. FIG. 7 shows that the tapes made with recipes using $(Gd_{0.65}Y_{0.65})$ and $(Gd_{0.75}Y_{0.75})$ exhibited a higher critical current in zero applied magnetic fields than the tape made according to the conventional, reference precursor recipe without Zr. In a magnetic field of about 0.1 T applied parallel to the tape, all three recipes, including the $(Gd_{0.80}Y_{0.80})$ recipe which had a lower zero field critical current, and show a higher current than the conventional or reference recipe. Additionally, at fields higher than about 0.1 T all three recipes are found to have resulted in higher critical current tapes compared to the conventional or reference recipe. In certain instances, the superconducting tapes, more specifically the superconductor, comprise the rare earth metals Gd and Y. In further instances, the ratio of GD to Y is about 1 to 1. In further alternate configurations, the superconducting tapes, more specifically the superconductor, comprise the rare earth metals Sm and Y. Still further, as illustrated, the dopant may comprise Zr As noted herein above, the it may be understood that superconducting tapes containing high levels of rare-earth content utilizing dopants Ta, Hf, Sn, Nb, Ti and Ce have similar critical current performance in a magnetic field of about 0.1 T applied parallel to the tape as the Zr-doped simulations shown and described herein. It may be understood that the rare earth dopants have a ratio of at least about 0.05 rare earth metals to about 3 copper in the superconducting structure.

TABLE I

| Recipe | Retention at 0.1 T ∥ a-b | Ic at 0.1 T ∥ a-b (A/12 mm) |
|---|---|---|
| $Gd_{0.65}Y_{0.65}Zr_{0.075}$ | 87% | 224 |
| $Gd_{0.75}Y_{0.75}Zr_{0.075}$ | 91% | 261 |
| $Gd_{0.80}Y_{0.80}Zr_{0.075}$ | 95% | 197 |
| $Gd_{1.5}Zr_{0.0}$ | 79% | 191 |

Table I summarizes the critical current values and the retention factor at about 0.1 T applied in the orientation of field parallel to the tape in all four samples described in FIG. 7. The retention factor is the ratio of the critical current value at about 0.1 T to the respective critical current value in zero applied fields. Table I shows, that the retention factor at about 0.1 T applied parallel to the tape increases steadily with increasing rare-earth content. Additionally, for the tapes having a rare-earth content of between about 1.5 and about 1.6, the retention factor exceeds about 90% at about 0.1 T.

Figure 8:
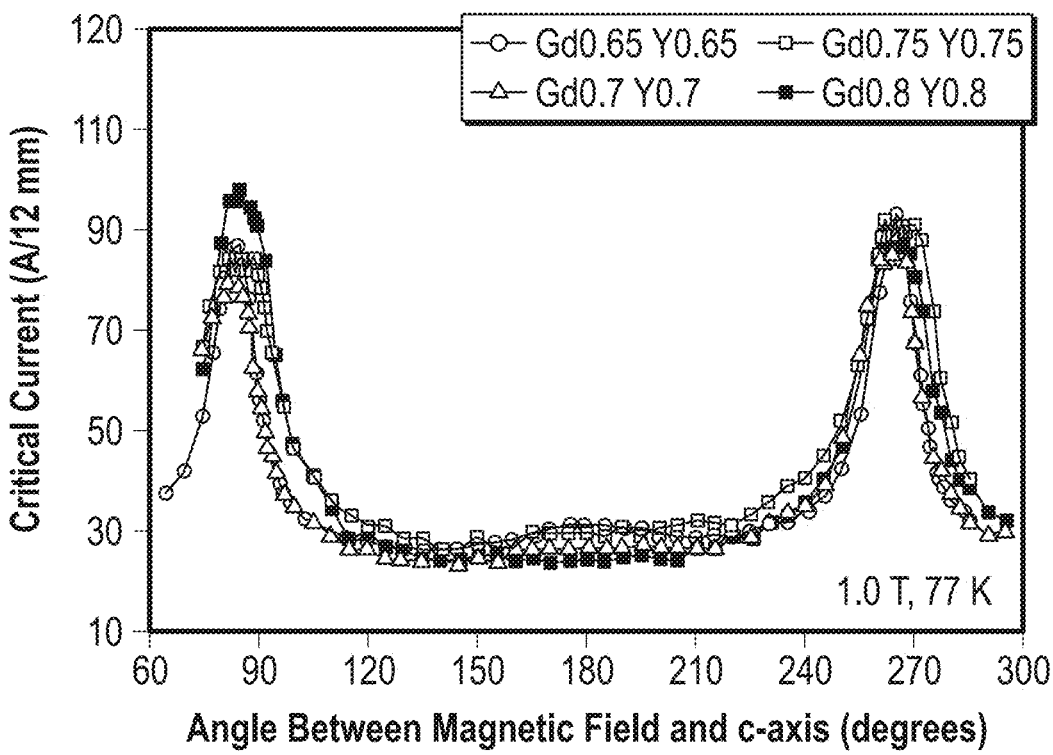
FIG. 8 illustrates a graphical analysis of the angular dependence of critical current of (Gd,Y)Ba—Cu—O tapes with no Zr doping and increasing content of Y and Gd, at 77 K, 1 T

Referring now to FIG. 8, if the critical current in the orientation of field applied parallel to the tape is due to increased rare-earth content and not to the presence of Zr, a composition of $(Y_xGd_x)$—Ba—Cu—O without Zr doping, having x in a range from about 0.65 to about 0.8 in about 0.05 steps may be fabricated and utilized. FIG. 8 displays the angular dependence of critical current of these tapes in a magnetic field of about 1 T. The graph in FIG. 8 illustrates minimal or no difference in the critical current performance of all four samples, which is dissimilar to the results on rare-earth content effect on Zr-doped samples, for example in FIG. 5. Additionally, the absolute magnitude of the critical current of the undoped samples when the magnetic field is applied parallel to the tape, is lower than that of the Zr-doped samples, also as shown in FIG. 5.

Table II summarizes the retention factor in critical current of samples with increasing rare earth content with and without Zr-doping in the magnetic field orientations, parallel and perpendicular to the tape, and in the orientation corresponding to the minimum critical current value. It may be seen therein that the retention factor in critical current in the orientation of field parallel to the tape is higher in the Zr-doped samples and increases with the rare-earth content.

TABLE II

| | $I_c(0)$ | $I_c$ (B ∥ tape) | | $I_c$ (B ⊥ tape) | | $I_c$ (min) | |
|---|---|---|---|---|---|---|---|
| | A/12 mm | A/12 mm | $I_c/I_c(0)$ | A/12 mm | $I_c/I_c(0)$ | A/12 mm | $I_c/I_c(0)$ |
| Zr doped | | | | | | | |
| $Gd_{0.65}Y_{0.65}$ | 312 | 88 | 28% | 77 | 25% | 50 | 16% |
| $Gd_{0.70}Y_{0.70}$ | 308 | 97 | 31% | 66 | 21% | 52 | 17% |
| $Gd_{0.75}Y_{0.75}$ | 304 | 113 | 37% | 54 | 18% | 52 | 17% |
| $Gd_{0.80}Y_{0.80}$ | 298 | 113 | 38% | 45 | 15% | 45 | 15% |
| undoped | | | | | | | |
| $Gd_{0.65}Y_{0.65}$ | 382 | 93 | 24% | 32 | 8% | 29 | 8% |
| $Gd_{0.70}Y_{0.70}$ | 376 | 88 | 23% | 27 | 7% | 25 | 7% |
| $Gd_{0.75}Y_{0.75}$ | 354 | 92 | 26% | 30 | 8% | 27 | 8% |
| $Gd_{0.80}Y_{0.80}$ | 382 | 99 | 26% | 25 | 7% | 25 | 7% |

Thus, increasing critical current in the orientation of field parallel to the tape, commensurate with increasing rare-earth content may be associated with the addition of zirconium.

Furthermore, the addition of Zr which results in formation of BaZrO$_3$ and could cause a depletion of Ba available to form the superconducting matrix. Subsequently, the addition of Zr could leave excess rare-earth available to form rare-earth oxide precipitates in the tape. Since these rare-earth oxide precipitates are prevalently disposed along the a-b plane, parallel to the tape surface, these precipitates could have led to improved flux pinning and critical current when the magnetic field is applied in this direction. The density of rare-earth oxide precipitates increase with increasing rare-earth content in Zr-doped samples. The increase in rare-earth precipitate content due to the excess rare-earth addition in the Zr doped samples, should determine that rare-earth addition in the undoped samples, at least at the same levels as in the Zr doped samples, will lead to an improvement in critical current in the orientation of a magnetic field applied parallel to the tape. As this improvement is not observed in the undoped samples with rare-earth additions, the disclosure herein provides a novel configuration and composition for the improved flux pinning in HTS.

Various embodiments are disclosed herein, and variations, combinations, and/or modifications of those embodiments and/or features of the embodiments made by a person having ordinary skill in the art are within the scope of the disclosure. Alternative embodiments that result from combining, integrating, and/or omitting features of the specifically-disclosed embodiments are also within the scope of the disclosure. Where numerical ranges or limitations are expressly stated, such express ranges or limitations should be understood to include iterative ranges or limitations of like magnitude falling within the expressly stated ranges or limitations (e.g., from about 1 to about 10 includes, 2, 3, 4, etc.; greater than 0.10 includes 0.11, 0.12, 0.13, etc.). As further examples, whenever a numerical range with a lower limit, R$_l$, and an upper limit, R$_u$, is disclosed, any number falling within the range is specifically disclosed. In particular, the following numbers within the range are specifically disclosed: R=R$_l$+k*(R$_u$-R$_l$), wherein k is a variable ranging from 1 percent to 100 percent with a 1 percent increment, i.e., k is 1 percent, 2 percent, 3 percent, 4 percent, 5 percent, . . . 50 percent, 51 percent, 52 percent . . . 95 percent, 96 percent, 97 percent, 98 percent, 99 percent, or 100 percent. Moreover, any numerical range defined by two R numbers as defined in the above is also specifically disclosed. Use of the term "optionally" with respect to any element of a claim means that the element is required, or alternatively, the element is not required, both alternatives being within the scope of the claim. Use of broader terms such as "comprises", "includes", and "having" should be understood to provide support for narrower terms such as "consisting of", "consisting essentially of", and "comprised substantially of". Accordingly, the scope of protection is not limited by the description set out above but is defined by the claims that follow, that scope including all equivalents of the subject matter of the claims. Each and every claim is incorporated as further disclosure into the specification, and the claims are exemplary embodiment(s) of the present invention. The discussion of a reference in the disclosure is not an admission that it is prior art, especially any reference that has a publication date after the priority date of this application. The disclosure of all patents, patent applications, and publications cited in the disclosure are hereby incorporated by reference, to the extent that they provide exemplary, procedural or other details supplementary to the disclosure.

What is claimed:

1. A superconducting tape comprising:
a plurality of nanocolumns oriented perpendicular to a surface of the superconducting tape,
the superconducting tape having a first critical current at 0 T at 77 K;
wherein the superconducting tape is configured to have a magnetic field applied thereto, wherein the magnetic field is applied parallel to the surface of the superconducting tape at about 0.1 T at 77 K; and
wherein the superconducting tape is configured to retain, upon application of the magnetic field, a second critical current that is at least about 90% of the first critical current.

2. The superconducting tape of claim 1, wherein the superconducting tape comprises copper and a rare-earth metal content of at least two of Gd, Y, Sm, Nd, Eu, Dy, Ho, Er or Yb, and wherein the superconducting tape comprises a ratio of the total rare-earth metals content to copper content of at least 1.5:3.

3. The superconducting tape of claim 2, wherein the rare-earth metals content comprises Y and one of Sm or Gd.

4. The superconducting tape of claim 3, wherein the ratio Y to Sm or Gd comprises a ratio of about 1:1.

5. The superconducting tape of claim 4, wherein the superconducting tape comprises copper and at least one dopant comprising Zr, Ta, Hf, Sn, Nb, Ti or Ce, and wherein the dopant content to copper content ratio comprises at least about 0.05 dopant to at least about 3 copper.

6. A superconducting tape comprising:
a plurality of nanocolumns oriented perpendicular to a surface of the superconducting tape, the superconducting tape having a first critical current at 0 T at 77 K;
wherein the superconducting tape is configured to have a magnetic field applied thereto, wherein the magnetic field is applied parallel to the surface of the superconducting tape at about 0.5 T at 77 K; and
wherein the superconducting tape is configured to retain, upon application of the magnetic field, a second critical current that is at least about 50% of the first critical current.

7. The superconducting tape of claim 6, wherein the superconducting tape comprises copper and a rare-earth metal content of at least two of Gd, Y, Sm, Nd, Eu, Dy, Ho, Er or Yb, and wherein the superconducting tape comprises a ratio of the total rare-earth metals content to copper content of at least 1.5:3.

8. The superconducting tape of claim 7, wherein the rare-earth metals content comprises Y and one of Sm or Gd.

9. The superconducting tape of claim 8, wherein the ratio Y to Sm or Gd comprises a ratio of about 1:1.

10. The superconducting tape of claim 9, wherein the superconducting tape comprises copper and at least one dopant comprising Zr, Ta, Hf, Sn, Nb, Ti or Ce, and wherein the dopant content to copper content ratio comprises at least about 0.05 dopant to at least about 3 copper.

11. A superconducting tape comprising:
a plurality of nanocolumns oriented perpendicular to a surface of the superconducting tape, the superconducting tape having a first critical current at 0 T at 77 K;
wherein the superconducting tape is configured to have a magnetic field applied thereto, wherein the magnetic field is applied parallel to the surface of the superconducting tape at about 1 T at 77 K; and wherein the superconducting tape is configured to retain, upon application of the magnetic field, a second critical current that is at least about 30% of the first critical current.

12. The superconducting tape of claim 11, wherein the superconducting tape comprises copper and a rare-earth metal content of at least two of Gd, Y, Sm, Nd, Eu, Dy, Ho, Er or Yb, and wherein the superconducting tape comprises a ratio of the total rare-earth metals content to copper content of at least 1.5:3.

13. The superconducting tape of claim 12, wherein the rare-earth metals content comprises Y and one of Sm or Gd.

14. The superconducting tape of claim 13, wherein the ratio Y to Sm or Gd comprises a ratio of about 1:1.

15. The superconducting tape of claim 14, wherein the superconducting tape comprises copper and at least one dopant comprising Zr, Ta, Hf, Sn, Nb, Ti or Ce, and wherein the dopant content to copper content ratio comprises at least about 0.05 dopant to at least about 3 copper.

* * * * *